United States Patent
Han et al.

(10) Patent No.: US 11,361,832 B2
(45) Date of Patent: Jun. 14, 2022

(54) STORAGE DEVICE AND OPERATING METHOD OF STORAGE DEVICE

(71) Applicant: SAMSUNG ELECTRONICS CO., LTD., Suwon-si (KR)

(72) Inventors: Hyunseung Han, Seoul (KR); Seonghyeog Choi, Hwaseong-si (KR); Youngsuk Ra, Seoul (KR); Hong Rak Son, Anyang-si (KR); Taehyun Song, Anyang-si (KR); Bohwan Jun, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/990,262

(22) Filed: Aug. 11, 2020

(65) Prior Publication Data

US 2021/0202012 A1 Jul. 1, 2021

(30) Foreign Application Priority Data

Dec. 26, 2019 (KR) .......................... 10-2019-0175560

(51) Int. Cl.
*H03M 13/29* (2006.01)
*G06F 11/10* (2006.01)
(Continued)

(52) U.S. Cl.
CPC ............ *G11C 16/26* (2013.01); *G06F 3/0619* (2013.01); *G06F 3/0659* (2013.01); *G06F 3/0679* (2013.01); *G06F 11/1068* (2013.01); *G11C 16/10* (2013.01); *H03M 13/1102* (2013.01); *G11C 16/0483* (2013.01); *G11C 16/08* (2013.01)

(58) Field of Classification Search
CPC ..... G11C 16/0483; G11C 16/26; G11C 16/08; G11C 11/5642; G11C 16/10; H03M 13/1102; G06F 3/0659; G06F 3/0679; G06F 11/1068; G06F 3/0619
See application file for complete search history.

(56) References Cited

U.S. PATENT DOCUMENTS 7,679,133 B2  3/2010  Son et al.
8,553,466 B2  10/2013  Han et al.
(Continued)

*Primary Examiner* — Guy J Lamarre
(74) *Attorney, Agent, or Firm* — Volentine, Whitt & Francos, PLLC

(57) ABSTRACT

A storage device includes a nonvolatile memory device and a memory controller. The memory controller receives first data from the nonvolatile memory device based on a first read command, and performs error correction on the first data. When the error correction fails, the memory controller transmits a second read command and second read voltage information to the nonvolatile memory device, receives second data from the nonvolatile memory device, transmits a third read command and third read voltage information to the nonvolatile memory device, and receives third data from the nonvolatile memory device. The memory controller adjusts an offset based on the second data and the third data, transmits a fourth read command, fourth read voltage information, and the offset to the nonvolatile memory device, receives fourth data from the nonvolatile memory device, and performs a soft decision process based on the fourth data.

20 Claims, 9 Drawing Sheets

(51) Int. Cl.

*G11C 16/26* (2006.01)
  *H03M 13/11* (2006.01)
  *G06F 3/06* (2006.01)
  *G11C 16/10* (2006.01)
  *G11C 16/04* (2006.01)
  *G11C 16/08* (2006.01)

(56) References Cited

U.S. PATENT DOCUMENTS

| | | |
|---|---|---|
| 8,559,235 B2 | 10/2013 | Yoon et al. |
| 8,654,587 B2 | 2/2014 | Yoon et al. |
| 8,804,421 B2 | 8/2014 | Motwani |
| 9,069,659 B1 | 6/2015 | Sabbag et al. |
| 9,129,711 B2 | 9/2015 | Kurosawa |
| 9,552,887 B2 | 1/2017 | Kim et al. |
| 9,741,402 B2 | 8/2017 | Jeon |
| 10,158,380 B2 | 12/2018 | Sharon et al. |
| 10,289,341 B2 | 5/2019 | Kirshenbaum et al. |
| 10,956,082 B1* | 3/2021 | Chen ............... G06F 3/0679 |
| 2011/0233648 A1 | 9/2011 | Seol et al. |
| 2013/0080858 A1* | 3/2013 | Lee ............... G11C 11/5642 714/773 |
| 2015/0262677 A1* | 9/2015 | Lin ............... G11C 16/08 365/185.12 |
| 2015/0332778 A1* | 11/2015 | Kim ............... G11C 11/5642 365/185.18 |
| 2016/0217868 A1* | 7/2016 | Dutta ............... G11C 16/349 |
| 2017/0097868 A1* | 4/2017 | Kim ............... G11C 7/00 |
| 2017/0162259 A1* | 6/2017 | Kim ............... G11C 16/26 |
| 2018/0261296 A1* | 9/2018 | Choi ............... G11C 16/24 |
| 2019/0043592 A1 | 2/2019 | Besinga et al. |
| 2019/0080752 A1* | 3/2019 | Hwang ............... G11C 11/5671 |
| 2019/0198097 A1 | 6/2019 | Kim et al. |
| 2019/0198122 A1* | 6/2019 | Yeh ............... G06F 11/1012 |
| 2020/0211656 A1* | 7/2020 | Oh ............... G11C 16/10 |

\* cited by examiner

STORAGE DEVICE AND OPERATING METHOD OF STORAGE DEVICE

CROSS-REFERENCE TO RELATED APPLICATIONS

This U.S. nonprovisional patent application claims priority under 35 U.S.C. § 119 to Korean Patent Application No. 10-2019-0175560, filed on Dec. 26, 2019 in the Korean Intellectual Property Office, the disclosure of which is incorporated by reference herein in the entirety.

BACKGROUND

1. Technical Field

Embodiments of the inventive concept(s) described herein relate to a semiconductor device. More particularly, embodiments of the inventive concept(s) described herein relate to a storage device that performs a read operation with improved reliability and an operating method of the storage device.

2. Description of the Related Art

A storage device is a device that stores data under control of a host device such as a computer, a smartphone, or a smart pad. One example of a type of a storage device is a device which stores data on a magnetic disk, such as a hard disk drive (HDD). Another example of a type of a storage device is a device which stores data in a semiconductor memory, in particular, a nonvolatile memory, such as a solid state drive (SSD) or a memory card.

A nonvolatile memory includes memory cells configured to store data. To increase the amount of data to be stored in the storage device that stores data in a nonvolatile memory, ways to increase the number of bits to be stored in each of memory cells are sought. As the number of bits stored in each of the memory cells increases, the probability that errors occur at data stored in the memory cells may increase.

Read methods capable of recovering original data even when errors occur at data stored in the memory cells are needed to secure the integrity of data stored in the memory cells.

SUMMARY

The inventive concept(s) described herein include a storage device that provides a read operation with improved reliability and an operating method of the storage device.

According to an exemplary embodiment, a storage device includes a nonvolatile memory device including a plurality of memory cells, and a memory controller that transmits a first read command and first read voltage information associated with the plurality of memory cells to the nonvolatile memory device, receives first data from the nonvolatile memory device based on the first read command, and performs error correction on the first data. When the error correction fails, the memory controller transmits a second read command and second read voltage information associated with the plurality of memory cells to the nonvolatile memory device, receives second data from the nonvolatile memory device based on the second read command, transmits a third read command and third read voltage information associated with the plurality of memory cells to the nonvolatile memory device, and receives third data from the nonvolatile memory device based on the third read command. The memory controller adjusts an offset based on the second data and the third data, transmits the offset, a fourth read command and fourth read voltage information associated with the plurality of memory cells to the nonvolatile memory device, receives fourth data from the nonvolatile memory device based on the fourth read command, and performs a soft decision process based on the fourth data.

According to an exemplary embodiment, a storage device includes a nonvolatile memory device including a plurality of memory cells, and a memory controller. The memory controller transmits a first read command and first read voltage information associated with the plurality of memory cells to the nonvolatile memory device, receives first data from the nonvolatile memory device based on the first read command, and performs error correction on the first data. When the error correction fails, the memory controller transmits a first offset, a second read command and second read voltage information associated with the plurality of memory cells to the nonvolatile memory device, receives second data from the nonvolatile memory device based on the second read command, and performs a first soft decision process based on the second data. When the first soft decision process fails, the memory controller transmits a third read command and third read voltage information associated with the plurality of memory cells to the nonvolatile memory device, receives third data from the nonvolatile memory device based on the third read command, transmits a fourth read command and fourth read voltage information associated with the plurality of memory cells to the nonvolatile memory device, and receives fourth data from the nonvolatile memory device based on the fourth read command. The memory controller adjusts the first offset to a second offset based on the third data and the fourth data, transmits the second offset, a fifth read command and fifth read voltage information associated with the plurality of memory cells to the nonvolatile memory device, receives fifth data from the nonvolatile memory device based on the fifth read command, and performs a second soft decision process based on the fifth data.

According to an exemplary embodiment, an operating method of a storage device which includes a nonvolatile memory device and a controller to control the nonvolatile memory device includes reading, at the controller, first data from the nonvolatile memory device by using a first read voltage, reading, at the controller, second data and third data from the nonvolatile memory device by using a second read voltage and a third read voltage, respectively, when error correction of the first data fails, adjusting, at the controller, an offset based on the second data and the third data, reading, at the controller, fourth data from the nonvolatile memory device by using a fourth read voltage and the adjusted offset, and performing, at the controller, a soft decision process based on the fourth data.

BRIEF DESCRIPTION OF THE FIGURES

The above and other objects and features of the present disclosure will become apparent by describing in detail exemplary embodiments thereof with reference to the accompanying drawings.

DETAILED DESCRIPTION

Below, embodiments of the present disclosure are described in detail and clearly to such an extent that one of ordinary skill in the relevant art(s) may easily implement the inventive concept(s) described herein.

Figure 1:
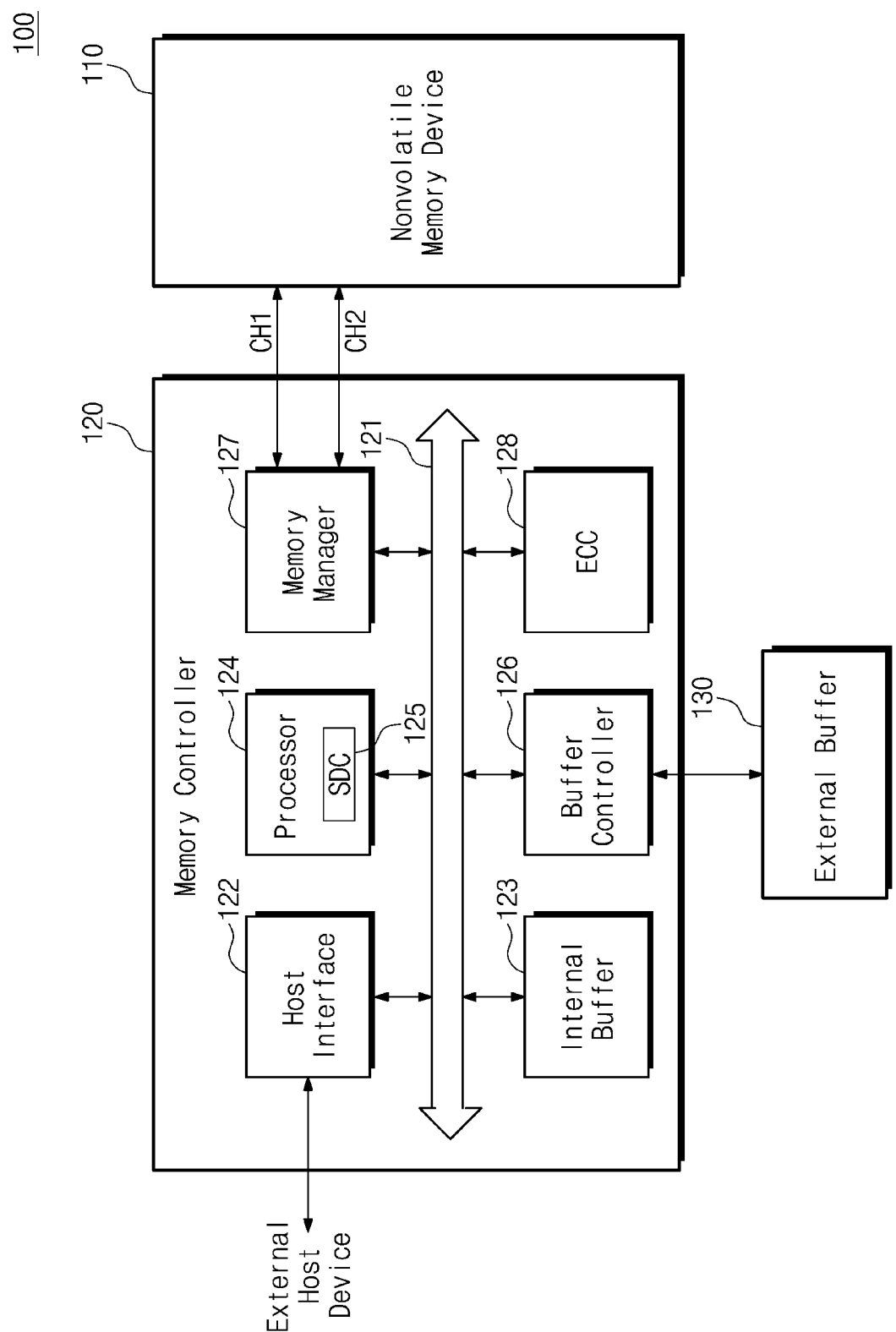
FIG. 1 illustrates a storage device according to an embodiment of the present disclosure.

FIG. 1 illustrates a storage device 100 according to an embodiment of the present disclosure. Referring to FIG. 1, the storage device 100 may include a nonvolatile memory device 110, a memory controller 120, and an external buffer 130. The nonvolatile memory device 110 may include a plurality of memory cells. Each of the plurality of memory cells may store two or more bits.

For example, the nonvolatile memory device 110 may be or include at least one of various nonvolatile memory devices such as a flash memory device, a phase change memory device, a ferroelectric memory device, a magnetic memory device, and a resistive memory device. To easily convey one or more technical aspects of the inventive concept(s) described herein, it is assumed that the nonvolatile memory device 110 is a flash memory device.

The memory controller 120 may receive from an external host device various requests for writing data to the nonvolatile memory device 110 or for reading data from the nonvolatile memory device 110. The memory controller 120 may store (or buffer) user data communicated with the external host device to the external buffer 130 and may store meta data for managing the storage device 100 to the external buffer 130.

The memory controller 120 may access the nonvolatile memory device 110 through a first channel CH1 and a second channel CH2. For example, the memory controller 120 may transmit a command and an address to the nonvolatile memory device 110 through the first channel CH1. The memory controller 120 may exchange data with the nonvolatile memory device 110 through the first channel CH1.

The memory controller 120 may transmit first control signals to the nonvolatile memory device 110 through the second channel CH2. The memory controller 120 may receive second control signals from the nonvolatile memory device 110 through the second channel CH2.

In an embodiment, the memory controller 120 may be configured to control two or more nonvolatile memory devices each individually represented by the nonvolatile memory device 110. The memory controller 120 may separately provide a designated first channel and a designated second channel for each of two or more nonvolatile memory devices.

For another example, the memory controller 120 may share one first channel with respect to two or more nonvolatile memory devices. The memory controller 120 may provide a second channel to two or more nonvolatile memory devices that share a portion of the second channel. The memory controller 120 may provide different portions of the second channel to the two or more nonvolatile memory device.

The external buffer 130 may include a random access memory. For example, the external buffer 130 may include at least one of a dynamic random access memory, a phase change random access memory, a ferroelectric random access memory, a magnetic random access memory, or a resistive random access memory.

The memory controller 120 may include a bus 121, a host interface 122, an internal buffer 123, a processor 124, a buffer controller 126, a memory manager 127, and an error correction code (ECC) block 128. The processor 124 may execute software instructions to fully or partially implement one or more aspects of processes described herein.

The bus 121 may provide communication channels between components in the memory controller 120. The host interface 122 may receive various requests from the external host device and may parse the received requests. The host interface 122 may store the parsed requests to the internal buffer 123.

The host interface 122 may transmit various responses to the external host device. The host interface 122 may exchange signals with the external host device in compliance with a given communication protocol. The internal buffer 123 may include a random access memory. For example, the internal buffer 123 may include a static random access memory or a dynamic random access memory.

The processor 124 may drive an operating system or firmware for driving the memory controller 120. The processor 124 may read the parsed requests stored in the internal buffer 123 and may generate commands and addresses for controlling the nonvolatile memory device 110. The processor 124 may transfer the generated commands and addresses to the memory manager 127.

The processor 124 may store various meta data for managing the storage device 100 to the internal buffer 123. The processor 124 may access the external buffer 130 through the buffer controller 126. The processor 124 may control the buffer controller 126 and the memory manager 127 such that the user data stored in the external buffer 130 are transmitted to the nonvolatile memory device 110.

The processor 124 may control the host interface 122 and the buffer controller 126 such that the data stored in the external buffer 130 are transmitted to the external host device. The processor 124 may control the buffer controller 126 and the memory manager 127 such that data received from the nonvolatile memory device 110 are stored to the external buffer 130. The processor 124 may control the host interface 122 and the buffer controller 126 such that data received from the external host device are stored to the external buffer 130.

Under control of the processor 124, the buffer controller 126 may write data to the external buffer 130 or may read data from the external buffer 130. The memory manager 127 may communicate with the nonvolatile memory device 110 through the first channel CH1 and the second channel CH2 under control of the processor 124.

The error correction code block 128 may perform error correction encoding on data to be transmitted to the nonvolatile memory device 110 by using an error correction code ECC. The error correction code block 128 may perform error correction decoding on data received from the nonvolatile memory device 110 by using the error correction code ECC.

The processor 124 may include a soft decision controller (SDC) 125. The soft decision controller (SDC) 125 may be implemented by the processor 124 executing a defined set of software instructions. When the error correction code block 128 fails in error correction of data that the memory manager 127 reads from the nonvolatile memory device 110 under control of the processor 124, the soft decision controller 125 may be activated.

The soft decision controller 125 may support a read operation that provides improving reliability and data integrity by recovering original data from data stored in the nonvolatile memory device 110 when the data include an error.

In an embodiment, the storage device 100 may not include the external buffer 130 and the buffer controller 126. When the external buffer 130 and the buffer controller 126 are not included in the storage device 100, the above functions of the external buffer 130 and the buffer controller 126 may be performed by the internal buffer 123.

Figure 2:
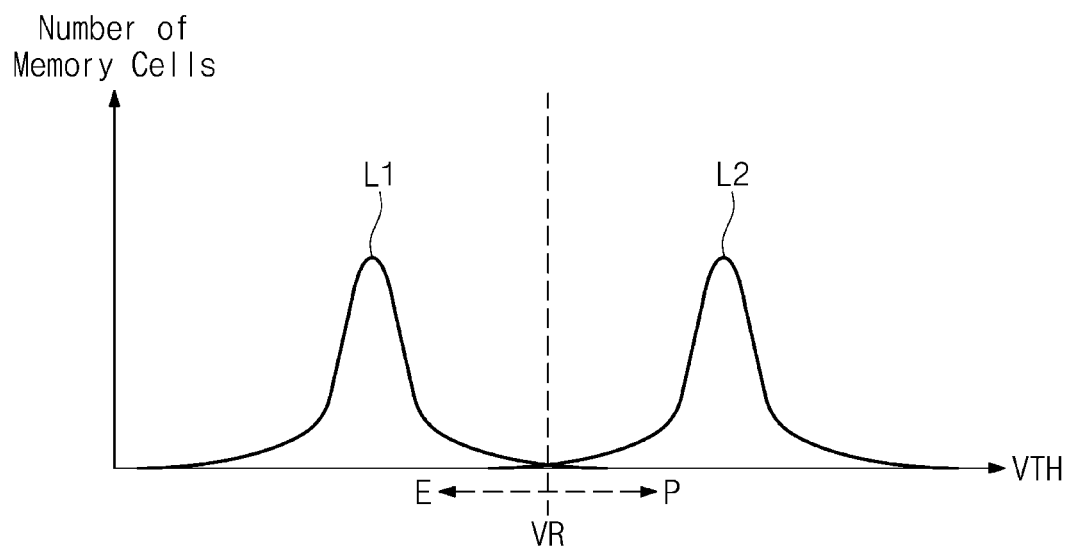
FIG. 2 illustrates an example of a hard decision-based read operation.

FIG. 2 illustrates an example of a hard decision-based read operation. In FIG. 2, a horizontal axis represents threshold voltages VTH of memory cells of the nonvolatile memory device 110, and a vertical axis represents the number of memory cells of the nonvolatile memory device 110. An example in which each of memory cells is programmed to have one of an erase state "E" and a program state "P" is illustrated in FIG. 2. The hard decision in a hard decision-based read operation may refer to a binary decision based on whether a memory cell has a threshold voltage lower than or higher than a read voltage VR.

In FIG. 2, a first line L1 may correspond to memory cells that are not programmed in a write operation and have the erase state "E". A second line L2 may correspond to memory cells that are programmed to have the program state "P" in the write operation.

Referring to FIGS. 1 and 2, in a read operation, the nonvolatile memory device 110 may perform the read operation by using a read voltage VR. A memory cell that has a threshold voltage lower than the read voltage VR may be turned on, and a memory cell that has a threshold voltage higher than the read voltage VR may be turned off.

The nonvolatile memory device 110 may identify the turned-on memory cell as the erase state "E" and may identify the turned-off memory cell as the program state "P". The nonvolatile memory device 110 may transmit the identified data to the memory controller 120.

As illustrated in FIG. 2, a part of the memory cells corresponding to the first line L1 may have threshold voltages higher than the read voltage VR. That is, a part of memory cells intended to have the erase state "E" may be identified as the program state "P".

Likewise, a part of memory cells corresponding to the second line L2 may have threshold voltages lower than the read voltage VR. That is, a part of memory cells intended to have the program state "P" may be identified as the erase state "E".

The error correction code block 128 may attempt error correction decoding on data received from the nonvolatile memory device 110. Data, which are identified as the program state "P", of data read from the memory cells corresponding to the first line L1 may be corrected to data of the erase state "E" through the error correction decoding. Also, data, which are identified as the erase state "E", of data read from the memory cells corresponding to the second line L2 may be corrected to data of the program state "P" through the error correction decoding.

As described with reference to FIG. 2, a hard decision-based read operation may be considered a read operation in which data are once read from memory cells of the states "E" and "P" by using the read voltage VR and the error correction decoding is performed on the read data.

Figure 3:
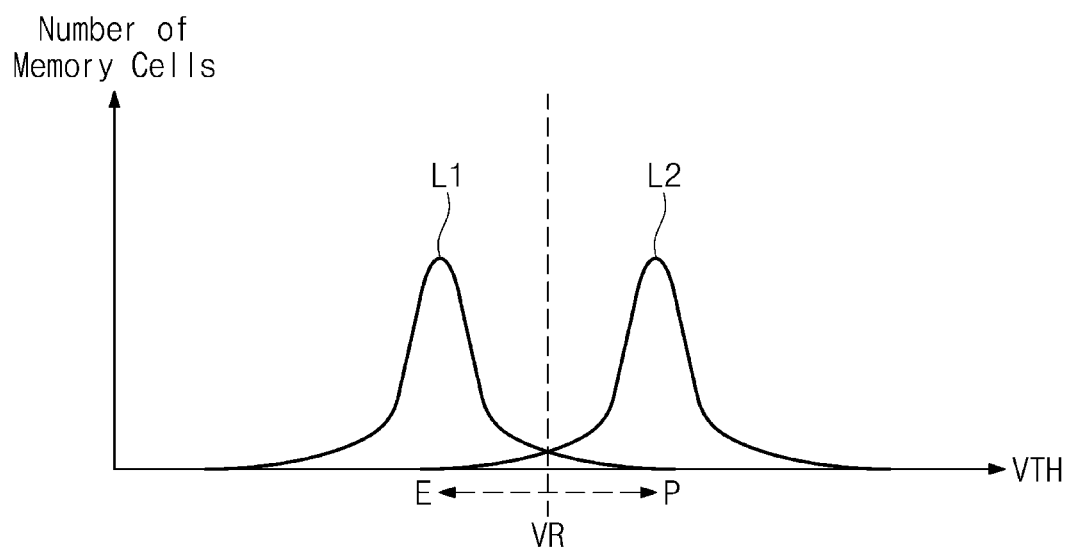
FIG. 3 illustrates an example in which uncorrectable errors occur in a hard decision-based read operation.

FIG. 3 illustrates an example in which uncorrectable errors occur in a hard decision-based read operation. Referring to FIGS. 1 and 3, the number of data identified as the program state "P" from among data read from memory cells that correspond to the first line L1 and are intended to have the erase state "E" may increase compared to FIG. 2.

Also, the number of data identified as the erase state "E" from among data read from memory cells that correspond to the second line L2 and are intended to have the program state "p" may increase compared to FIG. 2. Threshold voltages of memory cells may be changed unintentionally due to various causes such as retention, disturbance, and coupling. This change may be understood as resulting in degradation to data written in memory cells.

As the degradation of data written in memory cells progresses, the number of errors increases. When the number of errors exceeds a range correctable by the error correction code block 128, an uncorrectable error may occur. When an uncorrectable error occurs in the hard decision-based read operation, the memory controller 120 may perform subsequent read operations for recovering data. For example, the soft decision controller 125 of the processor 124 may be activated, and a soft decision-based read operation may be performed.

Figure 4:
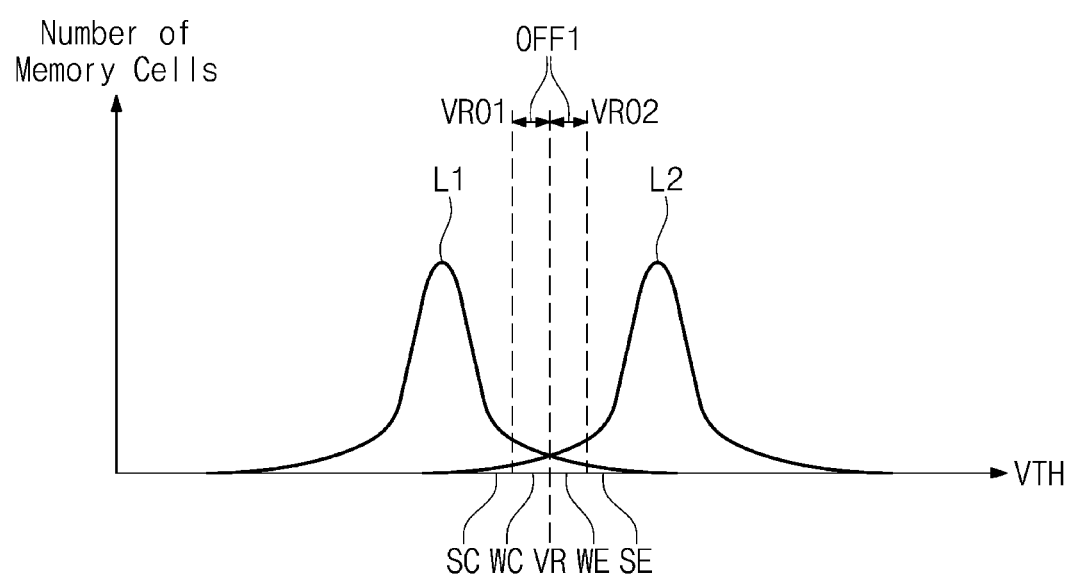
FIG. 4 illustrates an example of a soft decision-based read operation.

FIG. 4 illustrates an example of a soft decision-based read operation. As explained below, the soft decision process in a soft decision-based read operation may refer to a process that includes multiple determinations based on multiple inputs, wherein the multiple determinations may but do not necessarily conflict with one another.

Referring to FIGS. 1 and 4, the memory controller 120 may control the nonvolatile memory device 110 so as to perform a first read operation by using a first offset read voltage VRO1 lower than the read voltage VR by as much as a first offset OFF1. The memory controller 120 may also control the nonvolatile memory device 110 so as to perform a second read operation by using a second offset read voltage VRO2 higher than the read voltage VR by as much as the first offset OFF1. The labels along the horizontal axis for VTH in FIG. 4 generally correspond to proper labelling for L1. The proper labelling for L2 along the horizontal axis for VTH in FIG. 4 are generally in the opposite order of the labels shown in FIG. 4 and corresponding generally to proper labelling for L1.

The nonvolatile memory device 110 may perform an XOR operation on a first read result using the first offset read voltage VRO1 and a second read result using the second offset read voltage VRO2. An XOR operation produces a positive result such as "1" only when two inputs such as the first read result and the second read result differ. The nonvolatile memory device 110 may transmit the operation result to the memory controller 120.

Operation results of the XOR operation showing a memory cell to be in the same state (e.g., "E" or "P") using the first offset read voltage VR01 and the second offset read voltage VR02 may be "0" and operation results showing a memory cell to be in different states using the first offset read voltage VRO1 and the second offset read voltage VR02 may be "1". For example, an operation result corresponding to a memory cell that is determined to be in the same state in a first offset read operation using the first offset read voltage VRO1 and a second offset read operation using the second offset read voltage VRO2, may be "0". An operation result corresponding to a memory cell that is determined to be in different states in the first offset read operation using the first offset read voltage VRO1 and the second offset read operation using the second offset read voltage VRO2, may be "1". That is, the operation result of the XOR operation may indicate whether each of multiple memory cells is identified as having the same state or different states in the first offset read operation and the second offset read operation.

Threshold voltages for memory cells identified as having the erase state "E" in the hard decision-based read operation corresponding to the first line L1 are explained first, and these threshold voltages generally correspond to the labels along the horizontal axis for VTH in FIG. 4. A threshold voltage of a memory cell that is identified as having the erase state "E" in the hard decision-based read operation and is identified as having the same states in the operation result may be lower than the first offset read voltage VRO1. For the first line L1, these memory cells are above the horizontal axis for VTH in the portion labelled SC. Data of memory cells having threshold voltages lower than the first offset read voltage VRO1 from among memory cells corresponding to the first line L1 may be identified as strong correct (SC) bits.

A threshold voltage of a memory cell that is identified as having the erase state "E" in the hard decision-based read operation and is identified as having different states in the operation result may be higher than the first offset read voltage VRO1 and may be lower than the read voltage VR. For the first line L1, these memory cells are above the horizontal axis for VTH in the portion labelled WC. Data of memory cells having threshold voltages higher than the first offset read voltage VRO1 and lower than the read voltage VR from among the memory cells corresponding to the first line L1 may be identified as weak correct (WC) bits (or unreliable correct (UC) bits).

A threshold voltage of a memory cell that is identified as having the program state "P" in the hard decision-based read operation and is identified as having different states in the operation result may be higher than the read voltage VR and may be lower than the second offset read voltage VRO2. For the first line L1, these memory cells are above the horizontal axis for VTH in the portion labelled WE. Data of memory cells having threshold voltages higher than the read voltage VR and lower than the second offset read voltage VRO2 from among the memory cells corresponding to the first line L1 may be identified as weak error (WE) bits.

A threshold voltage of a memory cell that is identified as having the program state "P" in the hard decision-based read operation and is identified as having the same states in the operation result may be higher than the second offset read voltage VRO2. For the first line L1, these memory cells are above the horizontal axis for VTH in the portion labelled SE. Data of memory cells having threshold voltages higher than the second offset read voltage VRO2 from among the memory cells corresponding to the first line L1 may be identified as strong error (SE) bits (or hard error (HE) bits).

Data of memory cells having threshold voltages higher than the second offset read voltage VRO2 from among memory cells corresponding to the second line L2 may be identified as strong correct (SC) bits. For the second line L2, these memory cells are above the horizontal axis for VTH in the portion labelled SE rather than SC. Data of memory cells having threshold voltages higher than the read voltage VR and lower than the second offset read voltage VRO2 from among the memory cells corresponding to the second line L2 may be identified as weak correct (WC) bits (or unreliable correct (UC) bits). For the second line L2, these memory cells are above the horizontal axis for VTH in the portion labelled WE rather than WC. Data of memory cells having threshold voltages higher than the first offset read voltage VRO1 and lower than the read voltage VR from among the memory cells corresponding to the second line L2 may be identified as weak error (WE) bits. For the second line L2, these memory cells are above the horizontal axis for VTH in the portion labelled WC rather than WE. Data of memory cells having threshold voltages lower than the first offset read voltage VRO1 from among the memory cells corresponding to the second line L2 may be identified as strong error (SE) bits (or hard error (HE) bits). For the second line L2, these memory cells are above the horizontal axis for VTH in the portion labelled SC rather than SE.

As described above with respect to FIG. 4, strong correct (SC) bits for the first line L1 are those above the horizontal segment labelled SC, whereas strong correct (SC) bits for the second line L2 are those above the horizontal segment labelled SE. Weak correct (WC) bits for the first line L1 are those above the horizontal segment labelled WC, whereas weak correct (WC) bits for the second line are those above the horizontal segment labeled WE. Weak error (WE) bits for the first line L1 are those above the horizontal segment labelled WE, whereas weak error (WE) bits for the second line L2 are those above the horizontal segment labelled WC. Strong error (SE) bits for the first line L1 are those above the horizontal segment labelled SE, whereas strong error (SE) bits for the second line are those above the horizontal segment labelled SC.

The memory controller 120 may identify bits based on data read by using the read voltage VR and data read by using the first offset read voltage VRO1 and the second offset read voltage VRO2 and may allow the error correction code block 128 to perform a soft decision process by using the identification result.

For example, the error correction code block 128 may give scores to strong correct (SC) bits, weak correct (WC) bits, weak error (WE) bits, and strong error (SE) bits, respectively. The error correction code block 128 may correct errors by performing low density parity check (LDPC) decoding on the scored bits and may recover original data.

The storage device 100 according to an embodiment of the present disclosure may further be configured to perform a fine soft-decision process. The fine soft-decision process may be performed by the following: modeling distribution states of memory cells such as the first line L1 and the second line L2, adjusting an offset based on the modeling result, performing a read operation including at least two offset read operations based on the adjusted offset, and performing a soft decision process.

Figure 5:
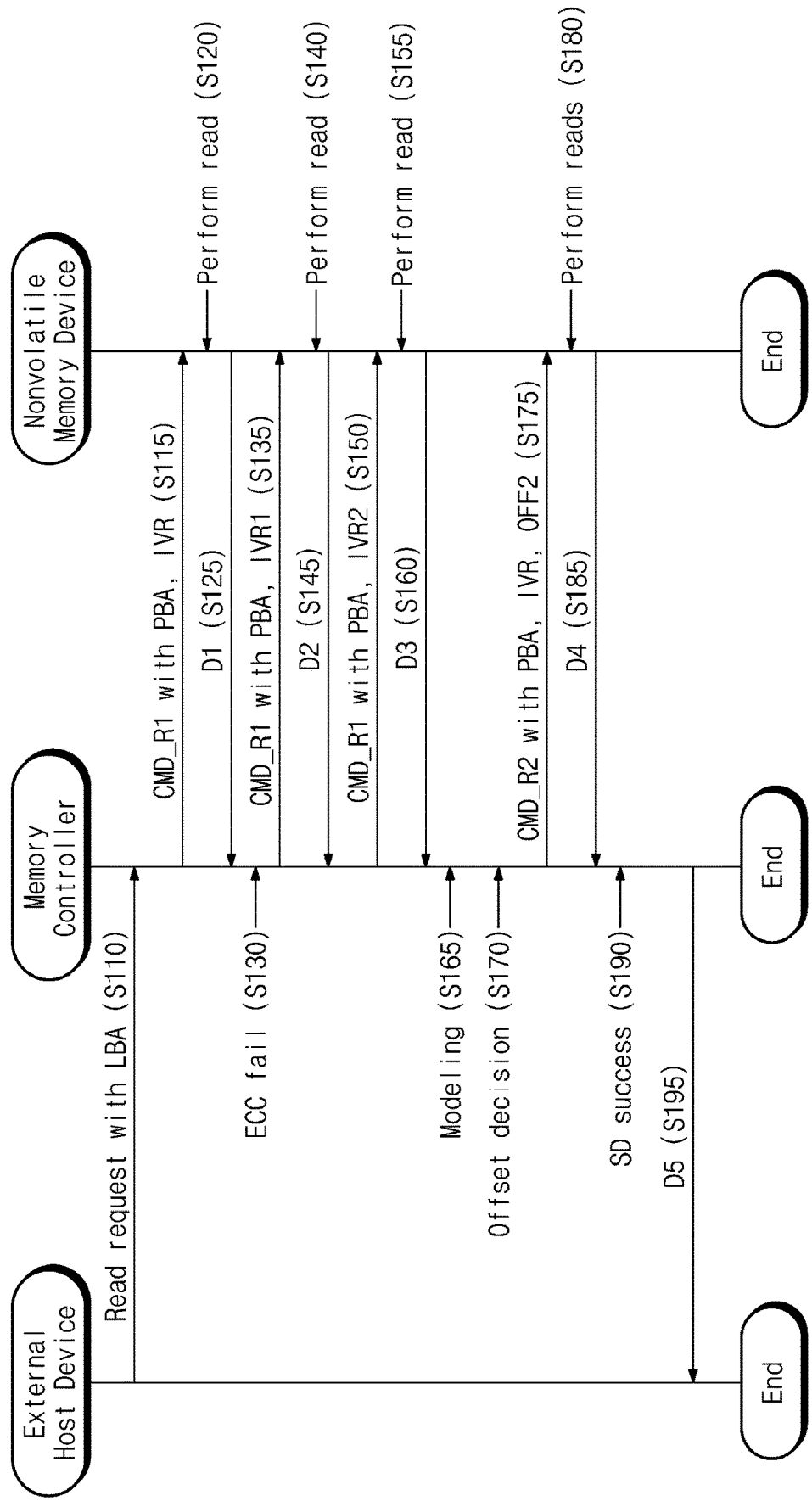
FIG. 5 is a flowchart illustrating an operating method of a storage device according to an embodiment of the present disclosure.

FIG. 5 is a flowchart illustrating an operating method of the storage device 100 according to an embodiment of the present disclosure. Referring to FIGS. 1 and 5, in operation S110, the memory controller 120 may receive a read request including a logical address LBA from the external host device.

The memory controller 120 may manage mapping information between logical addresses LBA of the external host device and physical addresses PBA of the nonvolatile memory device 110 as meta data. For example, the mapping information may be backed up to the nonvolatile memory device 110 and may be loaded onto the external buffer 130 or the internal buffer 123 if necessary.

The memory controller 120 may translate a logical address LBA to a physical address PBA by using the mapping information. In operation S115, the memory controller 120 may transmit a first read command CMD_R1 to the nonvolatile memory device 110 together with a physical address PBA and read voltage information IVR including information of a read level.

In operation S120, as described with reference to FIG. 3, the nonvolatile memory device 110 may read data from memory cells indicated by the physical address PBA by using a read level that the read voltage information IVR indicates. In operation S125, the nonvolatile memory device 110 may transmit first data D1 thus read to the memory controller 120. Operation S115 to operation S125 may correspond to one read operation. The operation at S115 may thus include transmission of a first read command (CMR_R1) and first read voltage information (IVR). The operation at S125 may thus include receipt of first data (D1) based on the first read command (CMD_R1 from S115).

In operation S130, the memory controller 120 may perform a hard decision process. For example, the memory controller 120 may perform error correction decoding on the first data D1 read by using the read voltage information IVR. In an embodiment, the error correction decoding may fail. Afterwards, the memory controller 120 may enter a procedure for recovering data stored in memory cells.

In operation S135, the memory controller 120 may transmit the first read command CMD_R1, the physical address PBA, and first read voltage information IVR1 to the nonvolatile memory device 110. A read level that the first read voltage information IVR1 indicates may be lower or higher than a read level that the read voltage information IVR indicates.

In operation S140, the nonvolatile memory device 110 may perform a read operation by using the read level that the first read voltage information IVR1 indicates. In operation S145, the nonvolatile memory device 110 may transmit second data D2 read in operation S140 to the memory controller 120. The operation at S135 may thus include transmission of a second read command (CMR_R1) and second read voltage information (IVR1). The operation at S145 may thus include receipt of second data (D2) based on the second read command (CMD_R1 from S135).

In operation S150, the memory controller 120 may transmit the first read command CMD_R1, the physical address PBA, and second read voltage information IVR2 to the nonvolatile memory device 110. A read level that the second read voltage information IVR2 indicates may be higher or lower than the read level that the read voltage information IVR indicates.

In operation S155, the nonvolatile memory device 110 may perform a read operation by using the read level that the second read voltage information IVR2 indicates. In operation S160, the nonvolatile memory device 110 may transmit third data D3 read in operation S155 to the memory controller 120. The operation at S150 may thus include transmission of a third read command (CMR_R1) and third read voltage information (IVR2). The operation at S160 may thus include receipt of third data (D3) based on the third read command (CMD_R1 from S150).

Operation S135 to operation S145 may correspond to one read operation and may be included in pre-read operations for the fine soft-decision process. Operation S150 to operation S160 may correspond to one read operation and may be included in pre-read operations for the fine soft-decision process.

In operation S165, the memory controller 120 may model threshold voltage distributions of memory cells, based on the second data D2 and the third data D3 read through the pre-read operations. The memory controller 120 may identify or adjust an offset based on the modeling of the threshold voltage distributions of memory cells from the second data D2 and the third data D3, and the offset may be transmitted to the nonvolatile memory device 110 at S175 as explained below.

Figure 6:
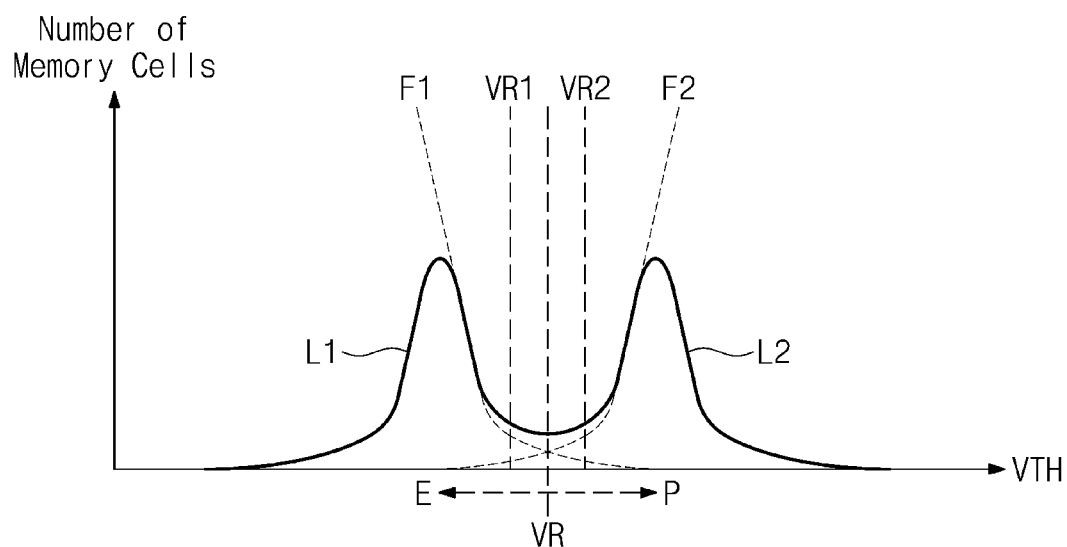
FIG. 6 is a diagram illustrating an example in which pre-read operations and modeling are performed.

FIG. 6 is a diagram illustrating an example in which pre-read operations and modeling are performed. Referring to FIGS. 1, 5, and 6, the first line L1 indicating memory cells intended to be the erase state "E" and the second line L2 indicating memory cells intended to be the program state "P" are illustrated, but threshold voltages actually identified from memory cells may not be classified into the first line L1 and the second line L2.

As illustrated by a solid line of FIG. 6, threshold voltages actually identified from memory cells may not be separately classified into the first line L1 and/or the second line L2. However, it is known that opposite ends of a threshold voltage distribution of memory cells is in the shape of exponentially decreasing.

Accordingly, a first function F1 may be modeled from one side (to the right) of the valley of the first line L1 (corresponding to the threshold voltage distribution for the erase state "E") to a portion of the threshold distribution of memory cells that overlaps the program state "P". Also, a second function F2 may be modeled from one side (to the left) of the valley of the second line L2 (corresponding to the threshold voltage for the program state "P") to a portion of the threshold distribution of memory cells that overlaps the erase state "E".

A read operation may be performed by using a first read voltage VR1 that the first read voltage information IVR1 indicates, and the number of on-cells (or turned-on memory cells) or off-cells (or turned-off memory cells) may be counted as a first count. Likewise, a read operation may be performed by using a second read voltage VR2 that the second read voltage information IVR2 indicates, and the number of on-cells or off-cells may be counted as a second count.

The memory controller 120 may model the first function F1 and the second function F2, based on the first count and the second count. For example, the memory controller 120 may manage count values and exponential functions corresponding to the count values as meta data. The memory controller 120 may model exponential functions with reference to the meta data.

In an embodiment, a level of the first read voltage VR1 and a level of the second read voltage VR2 may be fixed. For another example, the memory controller 120 may manage, as meta data, ranges of at least one of environment variables, such as a temperature, humidity, an erase count of memory cells, a time that elapses after data are written, the number of times of a read operation performed after data are written, and levels of the first read voltage VR1 and the second read voltage VR2 corresponding to the range. The memory controller 120 may determine the levels of the first read voltage VR1 and the second read voltage VR2 with reference to the meta data.

The number of times that a pre-read operation is performed is not limited to "2". The number of times that a pre-read operation is performed may be fixed. In contrast, the memory controller 120 may manage ranges of at least one of the above environment variables and the number of pre-read operations corresponding to the ranges as meta data and may determine the number of times that a pre-read operation is performed, with reference to the meta data.

In an embodiment, the memory controller 120 may model one exponential function applicable in common to the erase state "E" and the program state "P" or may model separate exponential functions respectively corresponding to the erase state "E" and the program state "P".

Returning to FIGS. 1 and 5, in operation S170, the memory controller 120 may decide an offset. For example, the offset may be decided based on a brute force. The memory controller 120 may set various offsets and may calculate the numbers of strong correct (SC) bits, weak correct (WC) bits, weak error (WE) bits, and strong error (SE) bits for each of the offsets.

The memory controller 120 may select an offset, in which the calculated numbers belong to a specific range, from among the offsets. For example, the memory controller 120 may select an offset based on a ratio (e.g., a first ratio) of the number of strong correct (SC) bits to the number of strong correct (SC) bits and weak correct (WC) bits, and a ratio (e.g., a second ratio) of the number of strong error (SE) bits to the number of weak error (WE) bits and strong error (SE) bits.

For example, as an offset increases, the number of weak correct (WC) bits and weak error (WE) bits may increase, and the discrimination between error bits and correct bits may decrease. As an offset decreases, a difference from the hard decision-based read operation may become less. The memory controller 120 may select an offset capable of securing the difference from the hard decision-based read operation while obtaining the discrimination. For example, the memory controller 120 may select an offset in which the first ratio is close to 90% and the second ratio is approximately 4%.

For another example, the memory controller 120 may include a machine learning algorithm trained to infer an offset. The memory controller 120 may infer an offset by using the machine learning algorithm. In operation S175, the memory controller 120 may transmit a second read command CMD_R2, the physical address PBA, the read voltage information IVR, and a second offset OFF2 decided in operation S170 to the nonvolatile memory device 110.

In an embodiment, the second offset OFF2 may include one offset applicable in common to the erase state "E" and the program state "P" or two offsets respectively corresponding to the erase state "E" and the program state "P". The two offsets may be identical or different.

In operation S180, as described with reference to FIG. 4, the nonvolatile memory device 110 may perform offset read operations by using the read level indicated by the read voltage information IVR and the second offset OFF2 and may perform an exclusive OR operation on results of the offset read operations. In operation S185, the nonvolatile memory device 110 may transmit a result of the exclusive OR operation as fourth data D4 to the memory controller 120. The operation at S175 may thus include transmission of the second offset OFF2, a fourth read command (CMR_R21) and fourth read voltage information (IVR). The operation at S185 may thus include receipt of fourth data (D2) based on the fourth read command (CMD_R2 from S175).

In operation S190, the memory controller 120 may perform a soft decision process for a soft decision (SD). For example, as described with reference to FIG. 4, the memory controller 120 may give scores to strong correct (SC) bits, weak correct (WC) bits, weak error (WE) bits, and strong error (SE) bits, respectively, and may perform the LDPC decoding.

In an embodiment, when the soft decision process succeeds, original data may be recovered. In operation S195, the memory controller 120 may provide the external host device with the recovered original data as fifth data D5.

As described above, the memory controller 120 may perform pre-read operations and may model threshold voltage distributions of memory cells. The memory controller 120 may decide an offset based on the modeling result and may perform the soft decision process. Because an offset is decided based on a state of a threshold voltage distribution of memory cells, the reliability of the soft decision process may be improved.

In an embodiment, the first read commands CMD_R1 may be transmitted together with the read voltage information IVR and may have the same codes. The second read command CMD_R2 may be transmitted together with read voltage information (e.g., IVR1 or IVR2) and an offset (e.g., OFF2) and may have a code different from that of the first read commands CMD_R1.

In an embodiment, in operation S170 in which an offset is decided, a read level indicated by the read voltage information IVR may also be changed (or modified). For example, the read level indicated by the read voltage information IVR may be changed to a level corresponding to an intersection of the first function F1 and the second function F2. That is, a read level indicated by the read voltage information IVR in operation S115 may be different from a read level indicated by the read voltage information IVR in operation S175.

As described above, the pre-read operations are for modeling the first function F1 and the second function F2. Accordingly, the error correction code block 128 may omit the error correction decoding associated with the second data D2 and the third data D3 being results of the pre-read operations. In an embodiment, the physical addresses PBA mentioned in FIG. 5 may indicate the same memory cells.

In an embodiment, in the case where at least a portion of the first count and the second count is collected in advance in the process of executing algorithms (e.g., defense codes) for recovering a read error, at least a part of the operations for collecting the first count and the second count may be omitted. The part of the operations which may be omitted may correspond to the portion collected in advance. In an embodiment, after original data are successfully recovered in operation S190, the memory controller 120 may perform a read reclaim operation to write the recovered data to other memory cells of the nonvolatile memory device 110. Because data are newly written through the read reclaim operation, the degradation of data may be recovered As described above, in the context of FIG. 5, S115 may be properly characterized as including transmission of a first read command and first read voltage information, S135 may be properly characterized as including transmission of a second read command and second read voltage information, S150 may be properly characterized as including transmission of a third read command and third read voltage information, and S175 may be properly characterized as including transmission of an offset, fourth read command and fourth read voltage information. S125 may be properly characterized as including reception of first data, S145 may be properly characterized as including reception of second data, S160 may be properly characterized as including reception of third data, and S185 may be properly characterized as including reception of fourth data. The offset transmitted at S175 is based on the modelling at S165, which in turn is performed based on the second data received at S145 and the third data received at S160. Accordingly, the offset transmitted at S175 is set or adjusted based on the second data received at S145 and the third data received at S160.

Figure 7:
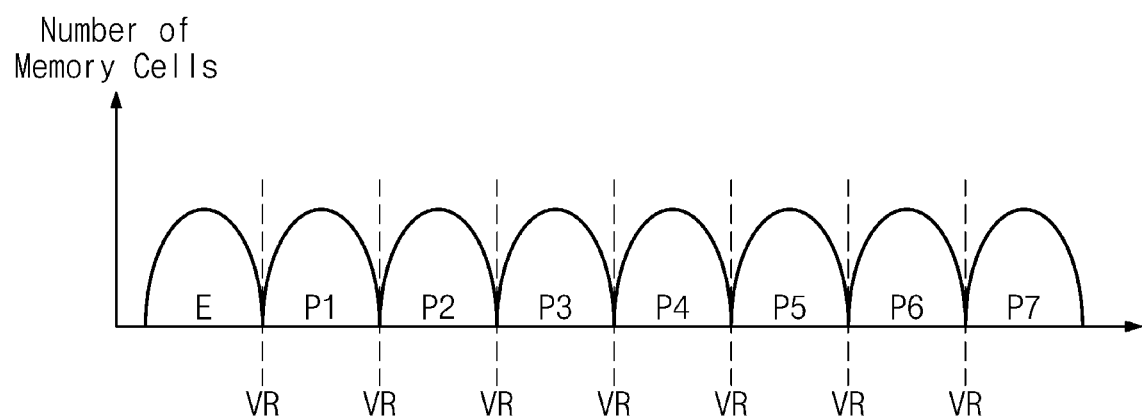
FIG. 7 illustrates threshold voltage distributions of memory cells when three bits are written to one memory cell.

FIG. 7 illustrates threshold voltage distributions of memory cells when three bits are written to one memory cell. Referring to FIGS. 1, 5, and 7, each of memory cells of the nonvolatile memory device 110 may be intended (e.g., programmed) to belong to a threshold voltage range corresponding to one of the erase state "E" and first program state P1 to seventh program state P7. 7 read voltages VR may be used between 8 states for the purpose of reading data from the memory cells.

When n bits are written to each of the memory cells, each of the memory cells may be intended to belong to one of 2n states. In a read operation, (2n−1) read voltages may be used to identify states of the memory cells.

Each of the read voltage information IVR, IVR1, and IVR2 in operation S115, operation S135, and operation S150 may include information about (2n−1) read levels. Alternatively, each of the read voltage information IVR, IVR1, and IVR2 in operation S115, operation S135, and operation S150 may include information indicating one of sets each including (2n−1) read levels. In each of operation S120 and operation S140, (2n−1) read operations may be performed by using (2n−1) read levels.

In operation S165, "2×(2n−1)" functions may be modeled in the case where different functions are modeled in two overlapping distribution states. Alternatively in operation S165, "2n−1" functions may be modeled in the case where the same function is modeled in two overlapping distribution states.

In operation S170, "2×(2n−1)" offsets may be decided in the case where different offsets are decided in two overlapping distribution states. Alternatively in operation S170, "2n−1" offsets may be decided in the case where the same offset is decided in two overlapping distribution states.

The read voltage information IVR in operation S175 may include information about (2n−1) read levels or information indicating one of sets each including (2n−1) read levels. In operation S175 the second offset OFF2 may include "2× (2n−1)" offsets in the case where different offsets are decided in two overlapping distribution states. Alternatively in operation S175 the second offset OFF2 may include "2n−1" offsets in the case where the same offset is decided in two overlapping distribution states.

For another example, in operation S175 the second offset OFF2 may include information indicating sets each including "2×(2n−1)" offsets in the case where different offsets are decided in two overlapping distribution states. Alternatively in operation S175, the second offset OFF2 may include one of sets each including "2n−1" offsets in the case where the same offset is decided in two overlapping distribution states. In operation S180, the nonvolatile memory device 110 may perform "2×(2n−1)" read operations.

Figure 8:
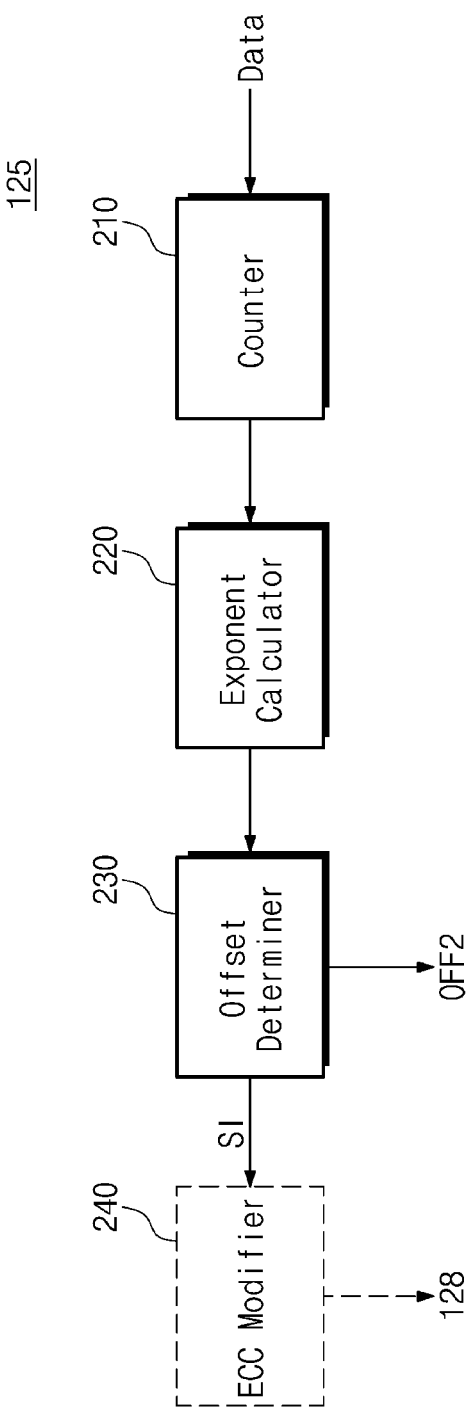
FIG. 8 illustrates a soft decision controller according to an embodiment of the present disclosure.

FIG. 8 illustrates the soft decision controller 125 according to an embodiment of the present disclosure. Referring to FIGS. 1, 5, and 8, the soft decision controller 125 may include a counter 210, an exponent calculator 220, an offset determiner 230, and an error correction code (ECC) modifier 240. The counter 210, the exponent calculator 220, the offset determiner 230 and the error correction code (ECC) modifier 240 may each be implemented by combinations of a pro-cessor and software executed by the processor, or by specific circuitry such as application specific integrated circuits (ASICs).

The counter 210 may count the number of on-cells or off-cells from data (e.g., the second data D2 and the third data D3) read by the pre-read operations. The exponent calculator 220 may calculate an exponential function or exponential functions from the count value of the counter 210.

For example, the exponent calculator 220 may manage count values and exponential functions corresponding to the count values as meta data. The exponent calculator 220 may select exponential functions with reference to the meta data. For another example, the exponent calculator 220 may include a machine learning algorithm trained to infer exponential functions from count values.

The offset determiner 230 may determine the second offset OFF2 from the exponential functions. For example, the offset determiner 230 may calculate the numbers of (strong, weak, correct, or error) bits corresponding to offsets based on the brute force and may select an offset based on the numbers of (strong, weak, correct, or error) bits.

For another example, the offset determiner 230 may mange parameters of an exponential function and offsets corresponding to the parameters as meta data. The offset determiner 230 may select an offset with reference to the meta data. For example, an exponential function may be in the form of "eax+b". Here, "x" may correspond to a horizontal axis, that is, a threshold voltage VTH. In the exponential function, a parameter may include "a" and "b".

For another example, the offset determiner 230 may include a machine learning algorithm trained to infer the second offset OFF2 from parameters of an exponential function. The offset determiner 230 may determine the second offset OFF2 by using the machine learning algorithm. For another example, the exponent calculator 220 and the offset determiner 230 may be integrated into a machine learning algorithm trained to infer the second offset OFF2 from count values.

The offset determiner 230 may transfer strength information SI about the second offset OFF2 to the ECC modifier 240. For example, the strength information SI may include a ratio (e.g. a first ratio) of the number of strong correct (SC) bits to the number of strong correct (SC) bits and weak correct (WC) bits, and a ratio (e.g., a second ratio) of the number of strong error (SE) bits to the number of weak error (WE) bits and strong error (SE) bits.

The ECC modifier 240 may modify internal operation parameters of the error correction code block 128, based on the first ratio and the second ratio. For example, when the number of weak bits (WE and WC bits) is lower than a first reference value, a score to be given to the weak bits may be increased. When the number of weak bits is higher than the second reference value, a score to be given to the weak bits may be decreased.

In an embodiment, the ECC modifier 240 may be optionally provided. The ECC modifier 240 may be provided in the soft decision controller 125 and may be selectively activated or deactivated. The ECC modifier 240 may not be included in the soft decision controller 125 and may be omitted.

Figure 9:
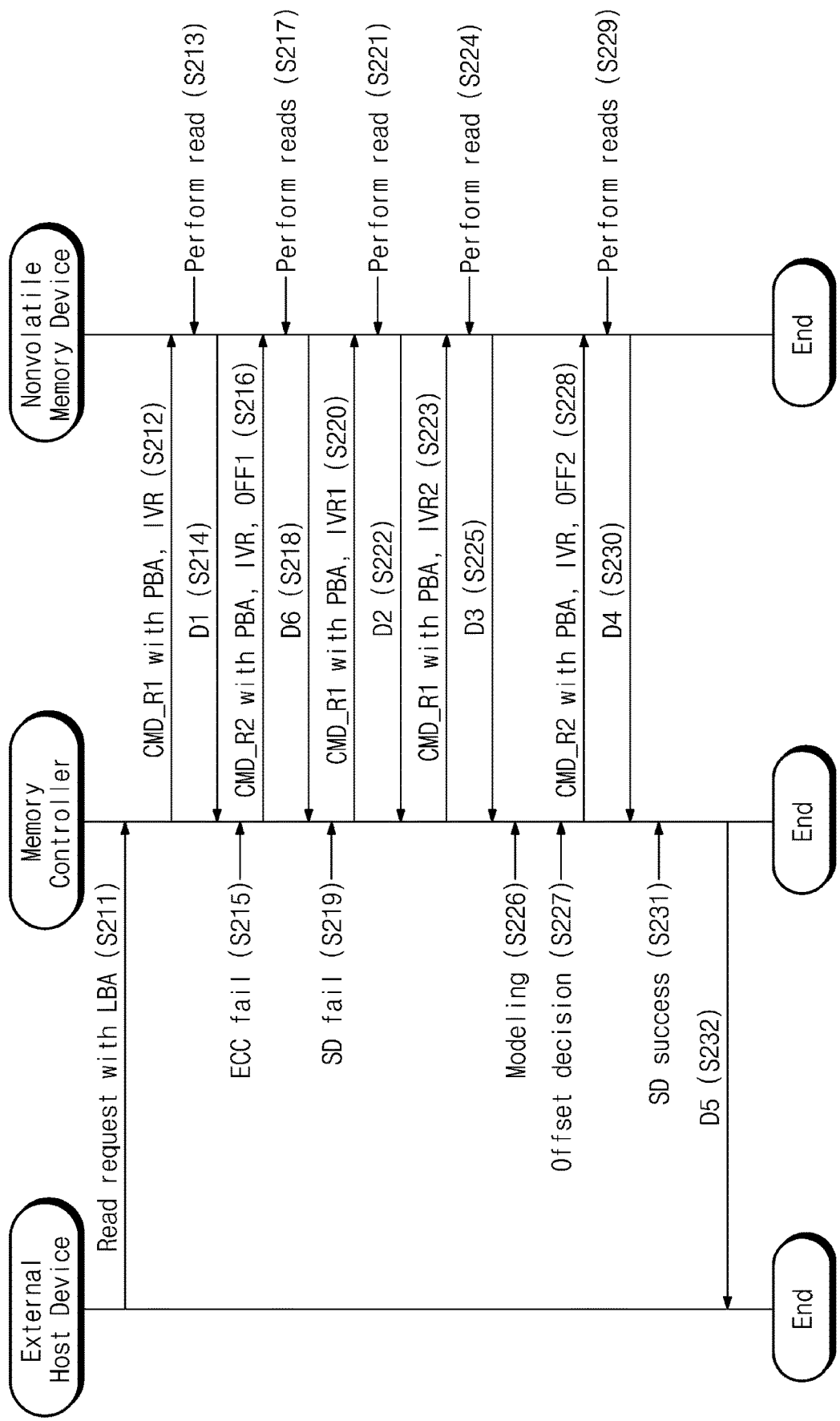
FIG. 9 is a flowchart illustrating an operating method of a storage device according to another embodiment of the present disclosure.

FIG. 9 is a flowchart illustrating an operating method of the storage device 100 according to another embodiment of the present disclosure. Referring to FIGS. 1 and 9, in operation S211, the memory controller 120 may receive a read request including a logical address LBA from the external host device. Operation S211 may be identical to operation S110 of FIG. 5. The description given with reference to operation S110 of FIG. 5 may be identically applied to operation S211.

In operation S212, the memory controller 120 may transmit the first read command CMD_R1, the physical address PBA, and read voltage information IVR to the nonvolatile memory device 110. In operation S213, the nonvolatile memory device 110 may perform a read operation. In operation S214, the nonvolatile memory device 110 may transmit the first data D1 thus read to the memory controller 120. Operation S212 to operation S214 may be identical to operation S115 to operation S125 of FIG. 5. The description given with reference to operation S115 to operation S125 of FIG. 5 may be identically applied to operation S212 to operation S214. The operation at S212 may thus include transmission of a sequential first read command (CMR_R1) and first read voltage information (IVR). The operation at S214 may thus include receipt of sequential first data (D1) based on the first read command (CMD_R1 from S212).

In operation S215, the memory controller 120 may perform error correction decoding. In an embodiment, the error correction decoding may fail. Operation S215 may be identical to operation S130 of FIG. 5. The description given with reference to operation S130 of FIG. 5 may be identically applied to operation S215 of FIG. 9.

As the error correction decoding fails, in operation S216, the memory controller 120 may transmit the second read command CMD_R2, the physical address PBA, the read voltage information IVR, and the first offset OFF1 to the nonvolatile memory device 110. The second read command CMD_R2 may direct read operations for a soft decision process. The first offset OFF1 may have a fixed value or a default value.

In operation S217, as described with reference to FIG. 4, the nonvolatile memory device 110 may perform an offset read operation by using the first offset read voltage VRO1 and may perform an offset read operation by using the second offset read voltage VRO2. In operation S218, the nonvolatile memory device 110 may transmit a result of the exclusive OR operation performed on the read results to the memory controller 120 as sixth data D6. The operation at S216 may thus include transmission of a sequential second read command (CMR_R2) and second read voltage information (IVR). The operation at S218 may thus include receipt of sequential second data (D6) based on the second read command (CMD_R2 from S216).

In operation S219, the memory controller 120 may perform a soft decision process for a soft decision (SD), based on the first data D1 and the sixth data D6. The memory controller 120 may identify strong correct (SC) bits, weak correct (WC) bits, weak error (WE) bits, and strong error (SE) bits and may give scores to the strong correct (SC) bits, the weak correct (WC) bits, the weak error (WE) bits, and the strong error (SE) bits, respectively. Afterwards, the memory controller 120 may perform the LDPC decoding. For example, the soft decision process for the soft decision (SD) may fail.

As the soft decision process for the soft decision fails, the memory controller 120 may perform pre-read operations. In operation S220, the memory controller 120 may transmit the first read command CMD_R1, the physical address PBA, and the first read voltage information IVR1 to the nonvolatile memory device 110.

In operation S221, the nonvolatile memory device 110 may perform a read operation by using a read level that the first read voltage information IVR1 indicates. In operation S222, the nonvolatile memory device 110 may transmit data read in operation S221 to the memory controller 120 as the second data D2. The operation at S220 may thus include transmission of a sequential third read command (CMR_R1) and third read voltage information (IVR1). The operation at S222 may thus include receipt of sequential third data (D2) based on the third read command (CMD_R1 from S220).

In operation S223, the memory controller 120 may transmit the first read command CMD_R1, the physical address PBA, and the second read voltage information IVR2 to the nonvolatile memory device 110. In operation S224, the nonvolatile memory device 110 may perform a read operation by using a read level that the second read voltage information IVR2 indicates. In operation S225, the nonvolatile memory device 110 may transmit data read in operation S224 to the memory controller 120 as the third data D3. The operation at S223 may thus include transmission of a sequential fourth read command (CMR_R1) and fourth read voltage information (IVR2). The operation at S225 may thus include receipt of sequential fourth data (D4) based on the fourth read command (CMD_R1 from S223).

In operation S226, the memory controller 120 may model exponential functions. The memory controller 120 may identify or adjust an offset based on the modeling of the threshold voltage distributions of memory cells from the second data D2 and the third data D3, and the offset may be transmitted to the nonvolatile memory device 110 at S228 as explained below. In operation S227, the memory controller 120 may decide an offset. In operation S228, the memory controller 120 may transmit the second read command CMD_R2, the physical address PBA, the read voltage information IVR, and the second offset OFF2 to the nonvolatile memory device 110.

In operation S229, as described with reference to FIG. 4, the nonvolatile memory device 110 may perform offset read operations by using two offset read voltages respectively indicated by the read voltage information IVR and the second offset OFF2. In operation S230, the nonvolatile memory device 110 may transmit data read in operation S229 to the memory controller 120 as the fourth data D4. The operation at S228 may thus include transmission of a sequential fifth read command (CMR_R2) and fifth read voltage information (IVR). The operation at S230 may thus include receipt of sequential fifth data (D4) based on the fifth read command (CMD_R2 from S228).

Operation S220 to operation S230 may be identical to operation S135 to operation S185 of FIG. 5. The description given with reference to operation S135 to operation S185 of FIG. 5 may be identically applied to operation S220 to operation S230 of FIG. 9.

In operation S231, the memory controller 120 may perform a soft decision process for a soft decision (SD). For example, as described with reference to operation S190 of FIG. 5, the memory controller 120 may identify strong correct (SC) bits, weak correct (WC) bits, weak error (WE) bits, and strong error (SE) bits, based on the first data D1 and the fourth data D4, and may give scores to the strong correct (SC) bits, the weak correct (WC) bits, the weak error (WE) bits, and the strong error (SE) bits, respectively. Afterwards, the memory controller 120 may perform the LDPC decoding.

For another example, the memory controller 120 may identify bits as six types of correct bits and error bits based further on the sixth data D6 and may give scores to the six types of correct bits and error bits, respectively. Afterwards, the memory controller 120 may perform the LDPC decoding. For example, the soft decision process for the soft decision (SD) may succeed. In operation S232, the memory controller 120 may provide the external host device with recovered data as the fifth data D5.

As described above, when a hard decision-based read operation fails, the storage device 100 may perform a soft decision process for a soft decision. In the case where the soft decision process fails, the storage device 100 may perform a fine soft-decision process including pre-read operations. In an embodiment, unless otherwise mentioned explicitly in the context, the descriptions given with reference to FIG. 5 may be identically applied to FIG. 9.

As described above, FIG. 9 may be properly characterized as including transmissions operations and reception operations characterizable as a sequence different from the labelling in FIG. 9. For example, in the context of FIG. 9 S212 may be properly characterized as including transmission of a first read command and first read voltage information, S216 may be properly characterized as including transmission of a first offset, a second read command and second read voltage information, S220 may be properly characterized as including transmission of a third read command and third read voltage information, S223 may be properly characterized as including transmission of a fourth read command and fourth read voltage information, and S228 may be properly characterized as including transmission of a second offset, a fifth read command and fifth read voltage information. S214 may be properly characterized as including reception of first data, S218 may be properly characterized as including reception of second data, S222 may be properly characterized as including reception of third data, S225 may be properly characterized as including reception of fourth data, and S230 may be properly characterized as including reception of fifth data. The second offset transmitted at S228 is based on the modelling at S226, which in turn is performed based on the third data received at S222 and the fourth data received at S225. Accordingly, the second offset transmitted at S228 is set or adjusted from the first offset transmitted at S216 based on the third data received at S222 and the fourth data received at S225.

Figure 10:
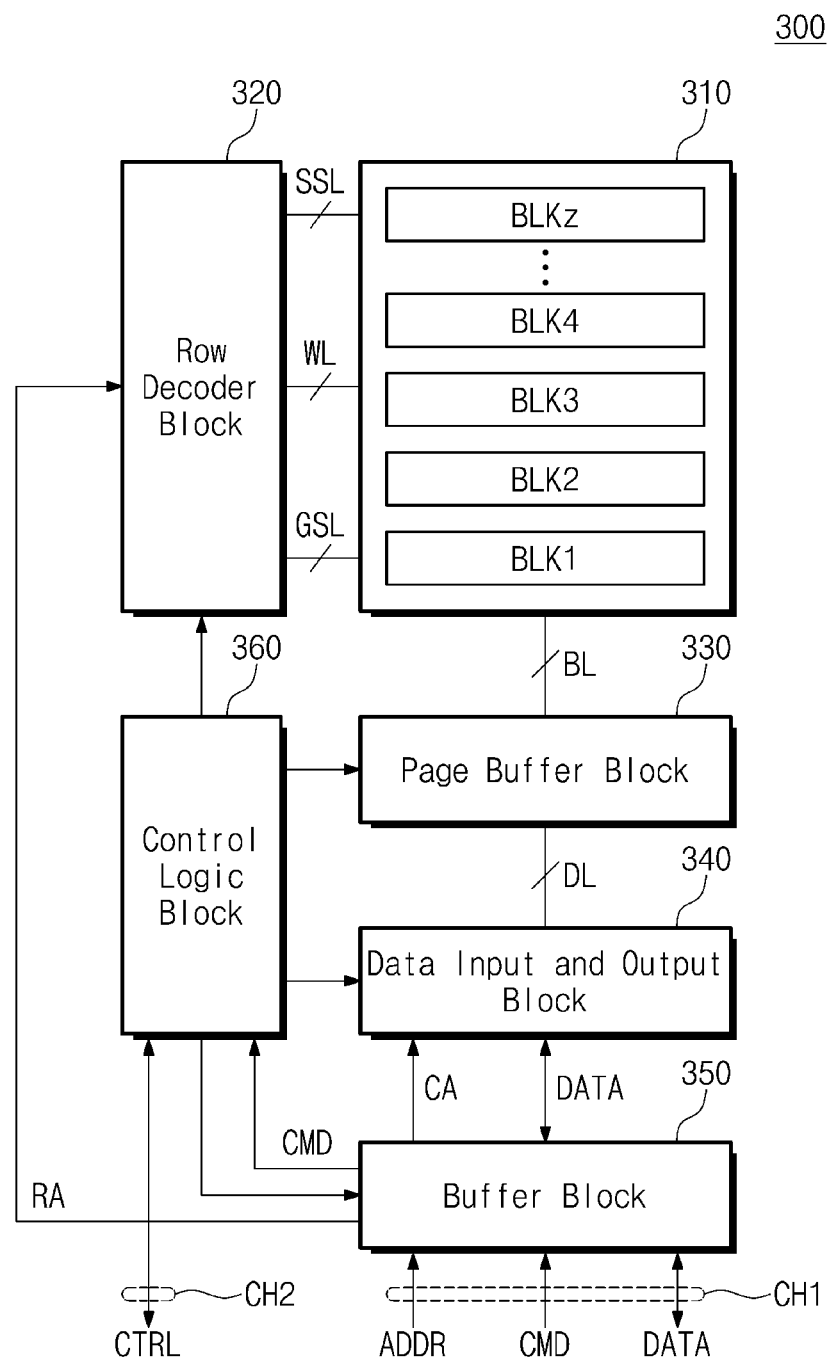
FIG. 10 is a block diagram illustrating a nonvolatile memory device according to an embodiment of the present disclosure.

FIG. 10 is a block diagram illustrating a nonvolatile memory device 300 according to an embodiment of the present disclosure. Referring to FIG. 10, the nonvolatile memory device 300 includes a memory cell array 310, a row decoder block 320, a page buffer block 330, a data input and output block 340, a buffer block 350, and a control logic block 360.

The memory cell array 310 includes a plurality of memory blocks BLK1 to BLKz. Each of the memory blocks BLK1 to BLKz may include a plurality of memory cells. Each of the memory blocks BLK1 to BLKz may be connected with the row decoder block 320 through at least one ground selection line GSL, word lines WL, and at least one string selection line SSL. Some of the word lines WL may be used as dummy word lines. Each of the memory blocks BLK1 to BLKz may be connected with the page buffer block 330 through a plurality of bit lines BL. The plurality of memory blocks BLK1 to BLKz may be connected in common with the plurality of bit lines BL.

In an embodiment, each of the memory blocks BLK1 to BLKz may be a unit of an erase operation. The memory cells belonging to each of the memory blocks BLK1 to BLKz may be erased at the same time. For another example, each of the plurality of memory blocks BLK1 to BLKz may be divided into a plurality of sub-blocks. Each of the plurality of sub-blocks may correspond to a unit of an erase operation.

The row decoder block 320 is connected with the memory cell array 310 through ground selection lines GSL, the word lines WL, and string selection lines SSL. The row decoder block 320 operates under control of the control logic block 360.

The row decoder block 320 may decode a row address RA received from the buffer block 350 and may control voltages to be applied to the string selection lines SSL, the word lines WL, and the ground selection lines GSL based on the decoded row address.

The page buffer block 330 is connected with the memory cell array 310 through the plurality of bit lines BL. The page buffer block 330 is connected with the data input and output block 340 through a plurality of data lines DL. The page buffer block 330 operates under control of the control logic block 360.

In a write operation, the page buffer block 330 may store data to be written to memory cells. The page buffer block 330 may apply voltages to the plurality of bit lines BL, based on the stored data. In a read operation or in a verify read operation that is performed in the write operation or the erase operation, the page buffer block 330 may sense voltages of the bit lines BL and may store the sensing result.

The data input and output block 340 is connected with the page buffer block 330 through the plurality of data lines DL. The data input and output block 340 may receive a column address CA from the buffer block 350. The data input and output block 340 may output the data read by the page buffer block 330 to the buffer block 350, based on the column address CA. The data input and output block 340 may provide data received from the buffer block 350 to the page buffer block 330, based on the column address CA.

The buffer block 350 may receive a command CMD and an address ADDR from an external device through the first channel CH1 and may exchange data "DATA" with the external device through the first channel CH1. The buffer block 350 may operate under control of the control logic block 360. The buffer block 350 may provide the command CMD to the control logic block 360. The buffer block 350 may provide the row address RA of the address ADDR to the row decoder block 320 and may provide the column address CA of the address ADDR to the data input and output block 340. The buffer block 350 may exchange the data "DATA" with the data input and output block 340.

The control logic block 360 may exchange control signals CTRL from the external device through the second channel CH2. The control logic block 360 may allow the buffer block 350 to route the command CMD, the address ADDR, and the data "DATA". The control logic block 360 may decode the command CMD received from the buffer block 350 and may control the nonvolatile memory device 300 based on the decoded command.

In an embodiment, the nonvolatile memory device 300 may further include a calculator for performing an exclusive OR operation on results of performing read operations by using read voltages that read voltage information and an offset indicate. The calculator may be included in the data input and output block 340, the buffer block 350, or the control logic block 360. For another example, the calculator may be interposed between the page buffer block 330 and the data input and output block 340 or between the data input and output block 340 and the buffer block 350.

In an embodiment, the nonvolatile memory device 300 may be manufactured in a bonding manner. The memory cell array 310 may be manufactured at a first wafer, and the row decoder block 320, the page buffer block 330, the data input and output block 340, the buffer block 350, and the control logic block 360 may be manufactured at a second wafer. The nonvolatile memory device 300 may be implemented by coupling the first wafer and the second wafer such that an upper surface of the first wafer and an upper surface of the second wafer face each other.

For another example, the nonvolatile memory device 300 may be manufactured in a cell over peri (COP) manner. A peripheral circuit including the row decoder block 320, the page buffer block 330, the data input and output block 340, the buffer block 350, and the control logic block 360 may be implemented on a substrate. The memory cell array 310 may be implemented over the peripheral circuit. The peripheral circuit and the memory cell array 310 may be connected by using through vias.

Figure 11:
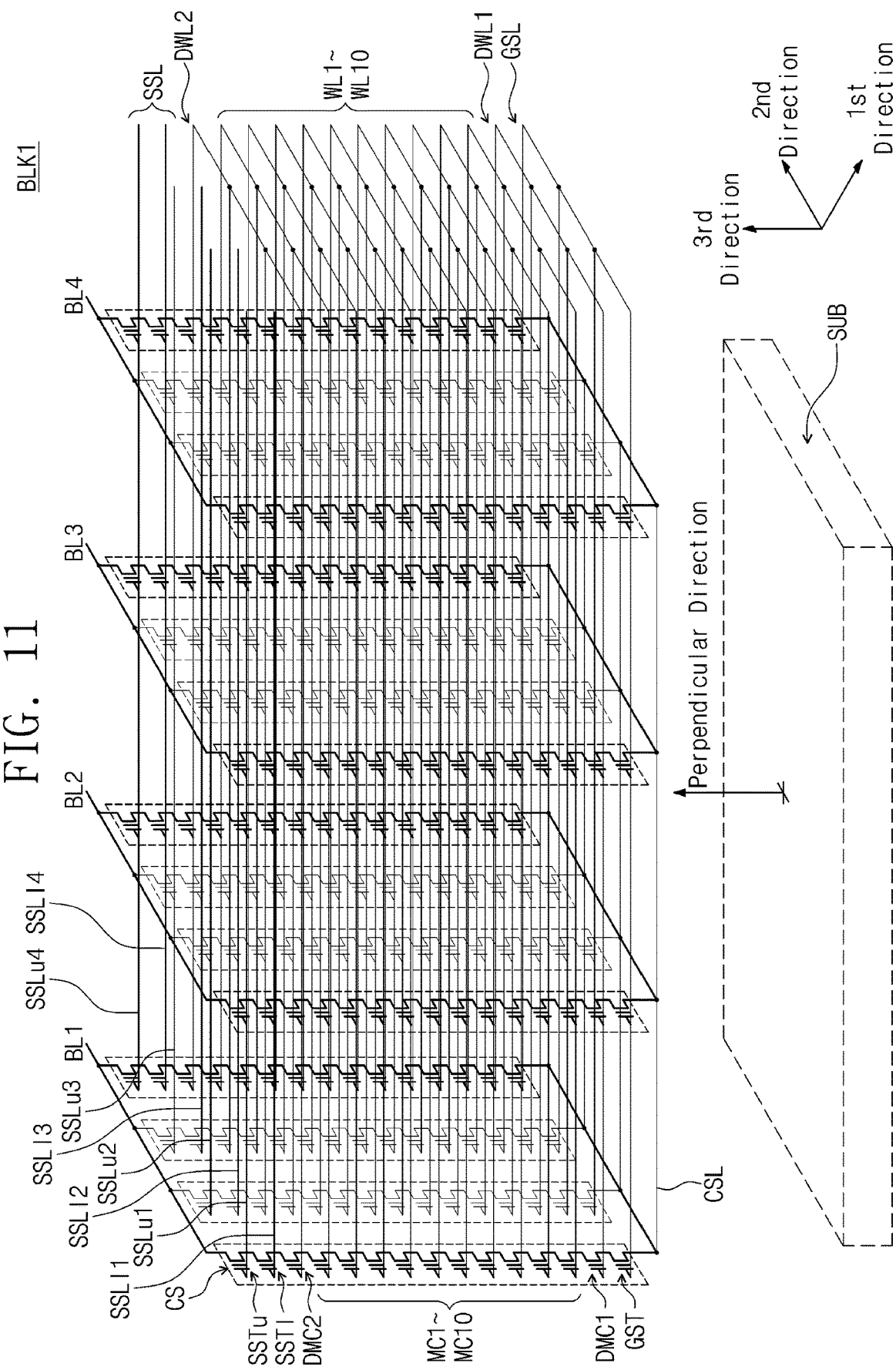
FIG. 11 illustrates an example of one memory block according to an embodiment of the present disclosure.

FIG. 11 illustrates an example of a memory block BLK1 according to an embodiment of the present disclosure. Referring to FIG. 11, a plurality of cell strings CS may be arranged in rows and columns on a substrate SUB along a first direction, a second direction, and a third direction. The plurality of cell strings CS may be connected in common with a common source line CSL formed on (or in) the substrate SUB. In FIG. 11, a location of the substrate SUB is exemplified to help understand a structure of the memory block BLK1.

Cell strings of the rows may be connected in common with the ground selection line GSL, and cell strings of each row may be connected with a corresponding one of first upper string selection line SSLu1 to fourth upper string selection line SSLu4 and a corresponding one of first lower string selection line SSL11 to fourth lower string selection line SSL14. Cell strings of each column may be connected to a corresponding one of first bit line BL1 to fourth bit line BL4. For brief illustration, cell strings connected with the second string selection lines SSL12 and SSLu2 and third string selection lines SSL13, and SSLu3 are depicted to be blurred.

Each cell string may include at least one ground selection transistor GST connected with the ground selection line GSL, a first dummy memory cell DMC1 connected with a first dummy word line DWL1, first memory cell MC1 to tenth memory cell MC10 respectively connected with first word line WL1 to tenth word line WL10, a second dummy memory cell DMC2 connected with a second dummy word line DWL2, and lower and upper string selection transistors SST1 and SSTu respectively connected with the corresponding lower and upper string selection lines.

In each cell string, the ground selection transistor GST, the first dummy memory cell DMC1, the first memory cell MC1 to tenth memory cell MC10, the second dummy memory cell DMC2, and the lower and upper string selection transistors SST1 and SSTu may be serially connected along the third direction perpendicular to the substrate SUB and may be sequentially stacked along the third direction perpendicular to the substrate SUB.

The memory block BLK1 may be provided as a three-dimensional (3D) memory array. The 3D memory array is monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In an embodiment of the present disclosure, the 3D memory array includes vertical cell strings CS (or NAND strings) that are vertically oriented such that at least one memory cell is located over another memory cell. The at least one memory cell may comprise a charge trap layer.

Each cell string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

In the description above, components according to several embodiments of the present disclosure are described by using the terms "first", "second", "third", and the like. However, the terms "first", "second", "third", and the like may be used to distinguish components from each other and do not limit the inventive concept(s) described herein. For example, the terms "first", "second", "third", and the like do not necessarily involve a sequential order or a numerical meaning of any form unless otherwise clear in the context of where these terms are used.

In the above embodiments, components according to embodiments of the present disclosure are described by using blocks. The blocks may be implemented with various hardware devices, such as an integrated circuit, an application specific IC (ASCI), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit or circuits enrolled as intellectual property (IP).

According to the inventive concept(s) described herein, an offset is decided based on a distribution of threshold voltages of memory cells, and a soft decision process is performed. Accordingly, a storage device is provided with improved reliability and an operating method of the storage device is provided to include performance of a read operation adaptively corresponding to states of the memory cells.

While the inventive concept(s) of the present disclosure have been described with reference to exemplary embodiments thereof, it will be apparent to those of ordinary skill in the art that various changes and modifications may be made thereto without departing from the spirit and scope of the present disclosure as set forth in the following claims.

What is claimed is:

1. A storage device, comprising:
a nonvolatile memory device including a plurality of memory cells; and
a memory controller configured to transmit a first read command and first read voltage information associated with the plurality of memory cells to the nonvolatile memory device, to receive first data from the nonvolatile memory device based on the first read command, and to perform error correction on the first data,
wherein, when the error correction fails, the memory controller is further configured to transmit a second read command and second read voltage information associated with the plurality of memory cells to the nonvolatile memory device, to receive second data from the nonvolatile memory device based on the second read command, to transmit a third read command and third read voltage information associated with the plurality of memory cells to the nonvolatile memory device, and to receive third data from the nonvolatile memory device based on the third read command, and wherein the memory controller is further configured to adjust an offset based on the second data and the third data, to transmit the offset, a fourth read command and fourth read voltage information associated with the plurality of memory cells to the nonvolatile memory device, to receive fourth data from the nonvolatile memory device based on the fourth read command, and to perform a soft decision process based on the fourth data.

2. The storage device of claim 1, wherein the first read command, the second read command, and the third read command include the same codes.

3. The storage device of claim 1, wherein a code of the fourth read command is different from codes of the first read command, the second read command, and the third read command.

4. The storage device of claim 1, wherein, in response to receiving one read command of the first read command, the second read command, and the third read command, the nonvolatile memory device is configured to perform a read operation on the plurality of memory cells by using a read level indicated by read voltage information corresponding to the received one read command from among the first read voltage information, the second read voltage information, and the third read voltage information.

5. The storage device of claim 1, wherein each of the first read voltage information, the second read voltage information, and the third read voltage information includes information about two or more read levels.

6. The storage device of claim 1, wherein, in response to the fourth read command, the nonvolatile memory device is configured to perform a read operation by using a first read level, which is obtained by subtracting the offset from a read level indicated by the fourth read voltage information, and a second read level, which is obtained by adding the offset to the read level indicated by the fourth read voltage information.

7. The storage device of claim 6, wherein, in response to the fourth read command, the nonvolatile memory device is further configured to perform an exclusive OR operation on a result of performing a read operation by using the first read level and a result of performing a read operation by using the second read level, and to provide the memory controller with a result of the exclusive OR operation as the fourth data.

8. The storage device of claim 1, wherein the controller calculates an equation of at least a portion of distributions of threshold voltages of the plurality of memory cells based on the second data and the third data, to calculate a first number of strong error bits, a second number of weak error bits, a third number of strong correct bits, and a fourth number of weak correct bits based on the equation, and to adjust the offset based on the first number, the second number, the third number, and the fourth number.

9. The storage device of claim 8, wherein the controller adjusts the offset such that a ratio of a sum of the second number and the fourth number to a sum of the first number, the second number, the third number, and the fourth number belongs to a target range.

10. The storage device of claim 1, wherein the controller is further configured to adjust the offset by using the second data and the third data, based on machine learning.

11. The storage device of claim 1, wherein, after the soft decision process succeeds, the controller is further config-ured to write data, which are read from the plurality of memory cells and are recovered, to a plurality of other memory cells.

12. The storage device of claim 1, wherein the controller is further configured to omit error correction associated with the second data and the third data.

13. The storage device of claim 1, wherein the controller is further configured to omit error correction associated with the fourth data.

14. The storage device of claim 1, wherein the controller is further configured to modify parameters to be used in the soft decision process, based on a first number of strong error bits predicted at the offset, a second number of weak error bits predicted at the offset, a third number of strong correct bits predicted at the offset, and a fourth number of weak correct bits predicted at the offset.

15. The storage device of claim 14, wherein the soft decision process is performed by low density parity check (LDPC) decoding, and wherein the controller is further configured to adjust scores to be given to the strong error bits, the weak error bits, the strong correct bits, and the weak correct bits, based on the first number, the second number, the third number, and the fourth number.

16. A storage device, comprising:

a nonvolatile memory device including a plurality of memory cells; and a memory controller configured to transmit a first read command and first read voltage information associated with the plurality of memory cells to the nonvolatile memory device, to receive first data from the nonvolatile memory device based on the first read command, and to perform error correction on the first data, wherein, when the error correction fails, the memory controller is further configured to transmit a first offset, a second read command and second read voltage information associated with the plurality of memory cells to the nonvolatile memory device, to receive second data from the nonvolatile memory device based on the second read command, and to perform a first soft decision process based on the second data, wherein, when the first soft decision process fails, the memory controller is further configured to transmit a third read command and third read voltage information associated with the plurality of memory cells to the nonvolatile memory device, to receive third data from the nonvolatile memory device based on the third read command, to transmit a fourth read command and fourth read voltage information associated with the plurality of memory cells to the nonvolatile memory device, and to receive fourth data from the nonvolatile memory device based on the fourth read command, and wherein the memory controller is further configured to adjust the first offset to a second offset based on the third data and the fourth data, to transmit the second offset, a fifth read command and fifth read voltage information associated with the plurality of memory cells to the nonvolatile memory device, to receive fifth data from the nonvolatile memory device based on the fifth read command, and to perform a second soft decision process based on the fifth data.

17. The storage device of claim 16, wherein a first read level indicated by one of the second read voltage information and the third read voltage information is lower than a read level indicated by the first read voltage information, and a second read level indicated by the other of the second read voltage information and the third read voltage is higher than the read level indicated by the first read voltage information.

18. The storage device of claim 16, wherein the nonvolatile memory device includes a plurality of memory blocks, each of which includes memory cells stacked on a substrate in a direction perpendicular to the substrate,
   wherein memory cells placed at a same height from the substrate are connected with a plurality of sub-word lines, and
   wherein the plurality of memory cells are connected with one sub-word line.

19. The storage device of claim 16, wherein the second offset includes two offsets corresponding to one read level indicated by the fifth read voltage information.

20. An operating method of a storage device which includes a nonvolatile memory device and a controller to control the nonvolatile memory device, the operating method comprising:
   reading, at the controller, first data and second data from the nonvolatile memory device by using a first read voltage and a second read voltage, respectively;
   adjusting, at the controller, an offset based on the first data and the second data to improve reliability of a soft decision process;
   reading, at the controller, third data from the nonvolatile memory device by using a third read voltage and the offset adjusted based on the first data and the second data; and
   performing, at the controller, the soft decision process based on the third data, which is read by using the third read voltage and the offset adjusted based on the first data and the second data.

* * * * *